United States Patent [19]

Chaki et al.

[11] Patent Number: 4,523,485
[45] Date of Patent: Jun. 18, 1985

[54] CROSS-ARM MECHANISM IN A PUSHBUTTON TUNER

[75] Inventors: Takao Chaki; Mamoru Mogi, both of Tokyo, Japan

[73] Assignee: Clarion Co., Ltd., Tokyo, Japan

[21] Appl. No.: 448,557

[22] Filed: Dec. 10, 1982

[30] Foreign Application Priority Data

Dec. 14, 1981 [JP] Japan .................................. 56-200083
Dec. 15, 1981 [JP] Japan ........................... 56-185697[U]
Dec. 16, 1981 [JP] Japan ........................... 56-186296[U]

[51] Int. Cl.³ ................................................. H03J 5/12
[52] U.S. Cl. ...................................... 74/10.33; 334/7
[58] Field of Search ............................ 74/10.33; 334/7

[56] References Cited

U.S. PATENT DOCUMENTS 4,133,214  1/1979  Cicala ................................. 74/10.33
4,189,949  2/1980  Righi et al. ......................... 74/10.33
4,331,038  5/1982  Naoi ................................... 74/10.33

FOREIGN PATENT DOCUMENTS

82531    6/1980  Japan .................................. 74/10.33
125718   9/1980  Japan .................................. 74/10.33
2031673  4/1980  United Kingdom ............... 74/10.33

Primary Examiner—Allan D. Herrmann
Attorney, Agent, or Firm—Flynn, Thiel, Boutell & Tanis

[57] ABSTRACT

A cross arm mechanism in a pushbutton tuner in which a setting plate is pivotally mounted on a cross arm and a plate spring is also disposed on the cross arm so as to hold the setting plate from both sides. The plate spring is movable together with the pushbutton in the length direction of the cross arm upon advancement of the pushbutton. The cross arm has at the front end protuberances for tightening the setting plate by narrowing the width of the opened end of the setting plate upon advancement of the plate spring.

6 Claims, 23 Drawing Figures

CROSS-ARM MECHANISM IN A PUSHBUTTON TUNER

BACKGROUND OF THE INVENTION

1. Field of the Invention

This invention relates to a cross-arm mechanism in a pushbutton tuner.

2. Description of the Prior Art

Pushbuttons in general are so arranged that a setting plate mounted on a cross arm is adequately changed in its fixture angle; the movement amount of a memory slide to be urged by the setting plate is accordingly selected; and a core which is moved simultaneously with a memory slide is inserted to a given extent within a tuning coil, thereby selecting a desired frequency.

Figure 1A:
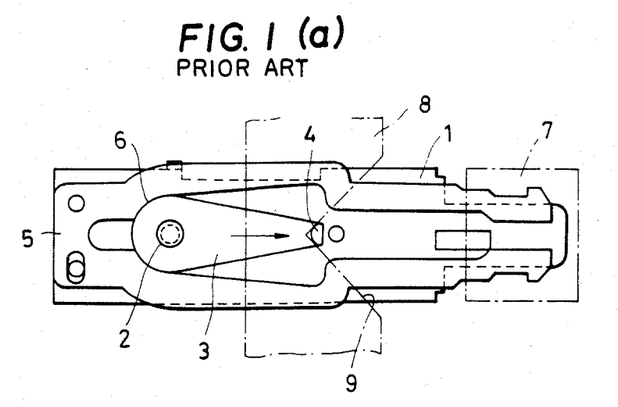
FIGS. 1(a) to 1(c) are plan views illustrating a cross arm mechanism in a pushbutton tuner which was formerly proposed by the present applicant.
Figure 1B:
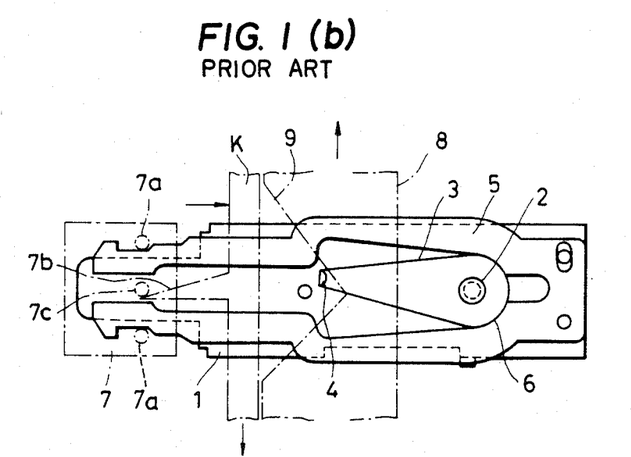
Figure 1C:
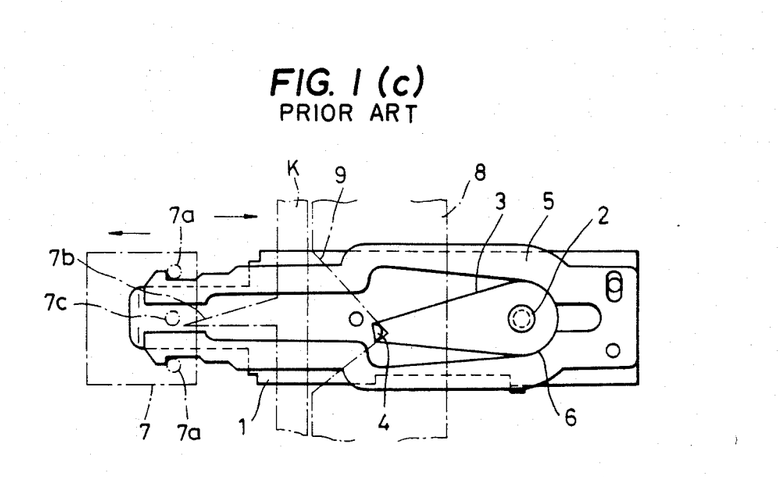

The present applicant already proposed a mechanism as shown in FIGS. 1(a), 1(b) and 1(c) as one of measures for fixing a setting plate at a desired angle on a cross arm.

Namely, on a cross arm 1 is secured a setting pin 2 and the setting pin 2 pivotally supports a setting plate 3 which is engaged therewith. The setting plate 3 is arc-shaped at one end thereof nearer to the front end of the cross arm, and triangular at the other end thereof nearer to the proximal end of the cross arm 1, respectively. That is, it is drop-shaped as a whole. At the side edge of said other end of the setting plate 3 is formed an urging protuberance 4 for urging a memory slide.

A substantially U-shaped plate spring 5 is mounted on the cross arm 1 in a manner surrounding the setting plate 3. The plate spring 5 is fixed at the front end thereof to the front end of the cross arm 1. The two legs, right and left, of the U-shape extend toward the proximal end of the cross arm 1 in a manner grasping the setting plate 3 from right and left directions. Further, the plate spring 5 has a circular tightening portion 6 at inner sides of the legs near the tip of the plate spring 5. The tightening portion 6 surrounds and contacts a front end portion of the setting plate 3 which is correspondingly configured in a circle.

A pushbutton 7 is coupled to the proximal end of the cross arm 1 and the proximal ends of the right and left legs of the plate spring 5. Fastening protuberances 7a of the pushbutton 7, when the pushbutton 7 is fully engaged with the cross arm 1, inwardly urge the right and left legs to tighten the legs, while when the pushbutton 7 is halfway pulled out of the cross arm 1, the urging force by the fastening protuberances 7a is released to thereby permit the right and left legs of the plate spring 5 to expand outward.

This cross arm mechanism functions as will be described hereunder.

To preset a frequency to be selected by a pushbutton, a tuning shaft associated with the pushbutton is previously rotated by hand to move the associated core which is moved simultaneously with rotation of the tuning shaft to a given extent within the associated tuning coil, thereby selecting a frequency to be set at the pushbutton. With this operation, a memory slide 8 which is movable simultaneously with the core means longitudinally and reaches a position corresponding to the frequency to be selected. Thereafter, the pushbutton 7 which is coupled to the proximal ends of the cross arm 1 and the plate spring 5 is halfway pulled out of them to release the fastening force against the plate spring 5. Then, the tightening portion 6 of the plate spring 5 expands outwardly and permits the front portion of the setting plate 3 to freely rotate about the setting pin 2.

When the pushbutton 7 and the cross arm 1 are pushed in the tuner, the urging protuberance 4 of the setting plate 3 gets in contact with a V-like cut-in 9 of the memory slide 8 and is guided by a sloping edge of the V-like cut-in 9 to reach the summit of the same. In this case, since the position of the summit of the V-like cut-in 9 is determined by the position of the memory slide 8, which corresponds to the position of the depth of the core within the tuning coil, the setting plate 3 rotates about the setting pin 2 so that the urging protuberance 4 reaches the summit of the V-like cut-in 9.

After the angle of the setting plate 3 is fixed to meet the summit of the V-like cut-in 9 of the memory slide 8, the pushbutton 7 at the proximal end of the cross arm 1 is further pushed in the tuner. At that time, since the cross arm 1 is prevented from advancing due to the memory slide 8, only the pushbutton 7 slides on the cross arm 1 to be thereby fully engaged with the cross arm 1. In this case, the proximal ends of the legs of the plate spring 5 are inwardly urged by the fastening protuberances 7a of the pushbutton 7 and are tightened narrower so as to strongly fasten the front portion of the setting plate 3. As the result, the setting plate 3 is fixed unmoved on the cross arm 1 with an angle corresponding to the position of the V-like cut-in 9 of the memory slide 8.

After that, the urging protuberance 4 of the setting plate 3 which was fixed on the cross arm 1 contacts the cut-in 9 whenever the pushbutton 7 is pushed in the tuner to shift the memory slide 8 and insert the core which moves simultaneously with the memory slide 8 to the given extent within the coil.

Pushbuttons in general are further so arranged that, upon selection of a frequency by pushing a given pushbutton in, a clutch mechanism which is provided between the pushbutton and a tuning shaft is actuated to attach the pushbutton and the tuning shaft in order not to apply the load of the tuning shaft to the pushbutton. To detach the connection of the pushbutton and the tuning shaft in response to pushing operation of the pushbutton, one conventional mechanism uses a kick arm K intersecting with the cross arms 1 of the pushbuttons as shown in FIG. 1(b). The kick arm K moves longitudinally of the pushbutton tuner when the pushbutton is pushed in because a tapered projection 7b of the kick arm K is urged by an urging protuberance 7c formed within the pushbutton, thereby attaching said connection. The kick arm K is returned to its original position due to a spring force when the pushing operation of the pushbutton is finished to thereby connect the pushbutton and the tuning shaft again.

3. Problems of the Prior Art

Said conventional mechanism is certainly advantageous in effecting reduction of total thickness of cross arm mechanism and accordingly reduction of the size and thickness of the pushbutton tuner as compared to a mechanism so arranged to urge a setting plate in an upward direction with a spring in order to fix the setting plate, because the former conventional mechanism is so arranged to fix the setting plate with a horizontal urging force. However, said conventional mechanism has the following drawbacks when it is practically used in a pushbutton tuner.

Figure 2:
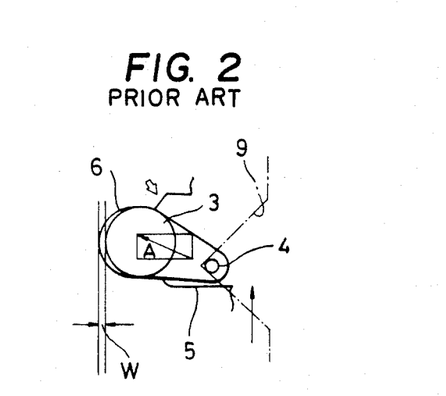
FIG. 2 is an enlarged plan view of said prior-art mechanism for explaining functions of the setting plate and the plate spring.
Figure 3:
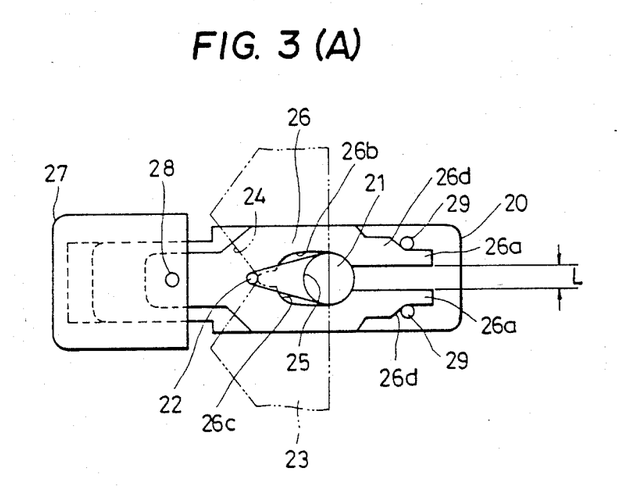
FIG. 3(a) is a plan view in which the setting plate is not fastened yet.
FIG. 3(b) is a sectional view of FIG. 3(a)

Namely, since the setting plate 3 has to be rotatably mounted with respect to the inner periphery of the plate spring which is to fasten the setting plate 3, a slight gap is kept between the setting plate 3 and the plate spring 5. Additionally, a further gap is inevitable between them due to manufacturing preciseness of the setting plate 3 and the plate spring 5. Therefore, upon locking the setting plate 3, the gap W (FIG. 2) exists between the inner periphery of the plate spring 5 which moves simultaneously with the cross arm 1 and the tip of the setting plate 3 which is engaged in the V-like cut-in 9 of the memory slide 8. This gap W functions to pull the setting plate 3 toward the tip of the cross arm 1 (arrow A direction in the Figure) when the plate spring 5 fastens the setting plate 3.

More specifically, since in the mechanism in FIGS. 1(a) to 1(c), the plate spring 5 which fastens the setting plate 3 is fixed at the tip thereof to the cross arm, an inward force applied in order to narrow the distance between the right and left legs of the plate spring 3 to fasten the setting plate 3 is directed from the proximal end to the front end of the cross arm. Particularly when the summit of the V-like cut-in 9 is in a position out of the center of the cross arm 1 (the center of the setting plate 3) so that the setting plate 3 is pulled diagonally of the cross arm 1, said force functions as being a longitudinal component of force.

As the result, the setting plate 3 which was pulled by the longitudinal force component shifts the memory slide 8 longitudinally from the initial position of the same. Therefore, the memory slide 8 which has stopped at a position corresponding to a given frequency undesirably changes its position before the setting plate is locked. Due to this, the fixture angle of the setting plate 3 with respect to the cross arm 1 is also deviated, so that when the pushbutton is pushed in, a deviated frequency is selected.

In addition to that problem, the cross arm mechanism of FIGS. 1(a) to 1(c) needs a slide plate separately formed to move simultaneously with the pushbutton as being a means for tightening or expanding the plate spring for fastening the setting plate, because protuberances formed integrally with the pushbutton or protuberances of a plastic resin are apt to be deformed due to friction. This leads to increase of parts of the cross arm mechanism and complication of the construction. This means that mounting steps as well as total thickness of the cross arm mechanism are increased, resulting in prevention of reduction in size and thickness of the pushbutton tuner.

Further, said conventional pushbutton tuner has pushbuttons 7 made of a plastic resin. The pushbutton 7 has at the inner wall thereof fastening protuberances 7a for fastening the plate spring and an urging protuberance 7c for urging the kick arm both formed integrally. However, the conventional pushbutton which is molded with a plastic resin is apt to deform due to friction with the plate spring which is made of a metal if a user repeats operations for pulling halfway the pushbutton 7 from the proximal ends of the cross arm 1 and the plate spring 5 upon changing the fixture angle of the setting plate or further pushing the pushbutton 7 to slide on the cross arm 1 until fully engaged with the cross arm. Further, since the plastic protuberances are not strong enough to resist the reaction of the metallic plate spring 5, they sometimes are damaged, so that the setting plate cannot be fixed and tuning operation cannot be effected.

Further, if operations of the urging protuberances 7a for urging the kick arm K to attach the connection between the pushbutton and the tuning shaft is repeated for a long time, the plastic protuberances 7a wear down to make it impossible to attach said connection. Also, since the urging protuberances 7a are soft, the metallic projection of the kick arm K is sometimes caught by the protuberances 7a and cannot return to its original position, causing trouble of the mechanism.

OBJECT OF THE INVENTION

It is therefore an object of the present invention to provide a cross arm mechanism in a pushbutton tuner in which frequency deviation due to mis-positioning of the memory slide upon fastening of the setting plate by the plate spring never occurs and said fastening operation of the setting plate by the plate spring is effected without using a separate member like a slide plate to thereby contribute to reliable performance and reduction in size and thickness of the cross arm mechanism and the pushbutton tuner.

Another object of the present invention is to provide a pushbutton in a pushbutton tuner which is so strong as to resist friction during repeated operations for a long time and to resist the reaction of the plate spring.

A still further object of the present invention is to provide a pushbutton in a pushbutton tuner which is not worn down even upon repeated pressing operations of the kick arm for a long time to thereby smoothly effect its function.

SUMMARY OF THE INVENTION

In a first construction of the cross arm mechanism of the pushbutton tuner according to the present invention: a setting plate is pivotally mounted on a cross arm; a plate spring which is opened at one end thereof corresponding to the front end of the cross arm is located on the cross arm in a manner holding the setting plate from both sides; the plate spring is movable simultaneously with the pushbutton in the length direction of the cross arm; and the cross arm has, at the front end thereof, protuberances for narrowing the plate spring to thereby fasten the setting plate. Thereby, when the setting plate is tightened by the force applied from the front end direction of the cross arm, undesirable movement of the memory slide by the setting plate is prevented and the plate spring slides simultaneously with the pushbutton. Therefore, a separate member like a slide plate involved in the prior-art mechanism is not needed.

In a second construction according to the present invention: the protuberances of said pushbutton of the pushbutton tuner for fastening the plate spring are made of a metallic material stronger than a plastic resin and the metallic protuberances are incorporated in one body in the plastic-molded outer case of the pushbutton.

In a third construction of the present invention: the protuberance of said pushbutton for urging the kick arm is made of a metallic material stronger than a plastic resin; and the metallic protuberance is incorporated in one body in the plastic-molded outer case of the pushbutton.

BRIEF DESCRIPTION OF THE DRAWINGS

FIGS. 3(a), 3(b), 4(a) and 4(b) illustrate an embodiment of the cross arm mechanism according to the present invention, in which.

DETAILED DESCRIPTION OF THE PREFERRED EMBODIMENTS

The present invention will now be described in detail by way preferred embodiments illustrated in the drawings.

FIGS. 3(a) to 5(b) show an embodiment corresponding to the first construction according to the present invention. In this embodiment, a setting plate 21 is pivotally mounted on a central portion of a cross arm 20. The setting plate 21 is substantially drop-shaped with end thereof corresponding to the proximal end of the cross arm 20 being narrowed. The setting plate 21 has at the edge near said proximal end of the cross arm 20 a protuberance 22 extending upward for urging a memory slide 23. The protuberance 22 is engaged with a V-like cut-in 24 of the memory slide 23 which intersects with the cross arm 20 above the same. The setting plate 21 has a cylindrical drum portion 25 integrally formed therewith. The cylindrical drum portion 25 is concentric with the pivot axis of the setting plate 21.

A plate spring 26 is opened at one end thereof corresponding to the proximal end of the cross arm 20 in a manner surrounding the drum portion 25 of the setting plate 21. More specifically, the plate spring 26 has a pair of right and left levers 26a which extend substantially in parallel with the cross arm 20. These levers 26a are connected in one body at the end thereof adjacent to the proximal end of the cross arm 20 while being kept opened at the end thereof near the front end of the cross arm 20. Between the levers 26a is formed a slide portion 26b with the same diameter as the diameter of the drum portion 25 of the setting plate 21. The slide portion 26b is an elongated opening extending in the length direction of the cross arm 20 and is as long as the distance that the plate spring 26 can move on the cross arm 20. The proximal endside portion of the slide portion 26b of the plate spring 26 is a tightening portion 26c configured in a circle corresponding to the outer periphery of the drum portion 25.

The proximal end of the plate spring 26 is connected to a pushbutton 27 which is slidably engaged with the proximal end of the cross arm 20 through a fixture pin 28.

On the other hand, on the cross arm 20 near the tips of the levers 26a of the plate spring 26 are formed protuberances 29 so as to contact outer edges of the levers 26a, respectively. Each outer edge of the lever 26a to contact the protuberance 29 has a tapered portion 26d which is narrowed as approaching the tip of the cross arm 20. The tapered portion 26d extends from a portion where the protuberance 29 contacts the outer edge of the lever 26a when the plate spring is retracted, to a portion where the protuberance 29 contacts the same when the plate spring is advanced.

The distance between the outer edge of the levers 26a is the same as or narrower than the distance of the right and left protuberances 29 at the end of the plate spring nearest to the front end of the cross arm 20 while being wider than the distance between the protuberances at the portion of the plate spring nearer to the proximal end of the cross arm.

The cross arm mechanism with the construction as described in the above according to the present invention functions as will be explained hereunder.

First, to preset a frequency to a given pushbutton, the associated manual tuning knob is operated to set the pushbutton tuner at the given frequency. With this operation, the longitudinal position of the memory slide is determined in accordance with the frequency, so that the summit of the V-like cut-in 24 of the memory slide 23 stops at a given position in the width direction of the cross arm 20.

When the pushbutton 27 is pulled out of the cross arm 20 from that state, the plate spring 26 which is connected to the pushbutton 27 by the fixture pin 28 also moves on the cross arm 20 toward the user. Movement of the plate spring 26 is restricted by length of the slide portion 26b because the edges at the front end of the slide portion 26b abuts the outer periphery of the drum portion 25 of the setting plate 21. Therefore, the pushbutton 27 stops in a state halfway pulled out of the cross arm 20. Then, since the right and left protuberances 29 contact the narrow portion of the right and left levers 26a, respectively, the distance l between the inner peripheries of the levers 26a is kept relatively wide to thereby release the tightening force to the setting plate 21 and permit the same to freely rotate on the cross arm 20.

Next, when the pushbutton 27 is pushed to make the cross arm 20 advance, the urging protuberance 22 of the setting plate 21 moves along the slope of the V-like cut-in 24 of the memory slide 23 to finally reach the summit of the V-like cut-in 24. In accordance with this movement of the urging protuberance 22, the setting plate 22 pivots and is given its own angle. It should be noted that the plate spring 26 cannot advance on the cross arm 20 because the tapered portions 26d are engaged with the right and left protuberances 29, so that the urging force to the pushbutton 27 is transmitted to the cross arm 20 by way of the plate spring 26 to thereby make the cross arm 20 advance.

Figure 4A:
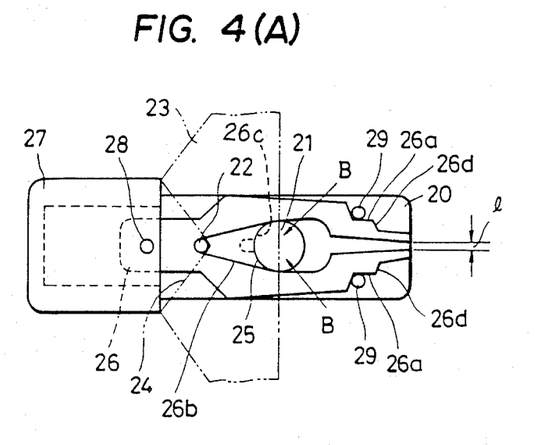
FIG. 4(a) is a plan view in which the setting plate is in a fastened state.
Figure 4B:
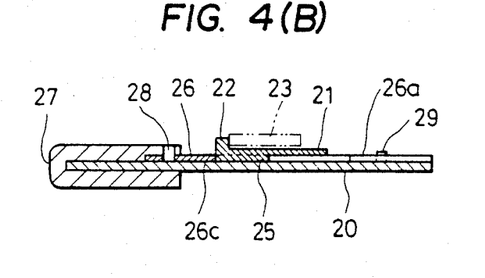
FIG. 4(b) is a sectional view of FIG. 4(a)

After the angle of the setting plate 21 is determined as described in the above, the cross arm 20, upon pushing operation of the pushbutton 27, cannot further advance because the setting plate 21 secured on the cross arm 20 is engaged with the memory slide 23 through the urging protuberance 22. Therefore, only the plate spring 26 which is connected to the pushbutton 27 advances as sliding on the cross arm 20. In this case, the plate spring 25 advances until the circular tightening portion 26c formed at the proximal end-side end of the slide portion 26b gets in contact with the outer periphery of the drum portion 25. Along with the advancement of the plate spring 26 on the cross arm 20, the protuberances 29 which were engaged with the narrow portion of the levers 26a pass over the tapered portions 26d and get in contact with the wider portion of the levers 26a.

As the result, as shown in FIG. 4(a), the width 1 between the levers 26a is narrowed to tighten the drum portion 25 of the setting plate 21 with the inner edges of the levers 26a and the circular tightening portion 26c of the plate spring 26, whereby the setting plate 21 is fixed unmoved on the cross arm 20.

Since the tightening force of the levers 26a is applied to the drum portion 25 from the front end side direction (arrow B direction in the Figure), the setting plate 21 never moves toward the front end of the cross arm 20, so that it is prevented that the memory slide 23 moves longitudinally as being pulled by the setting plate 21 to cause frequency deviation.

Figure 5A:
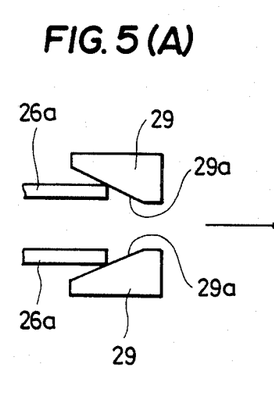
FIG. 5(a) and 5(b) are plan views of other embodiments of the means for narrowing the plate spring.
Figure 5B:
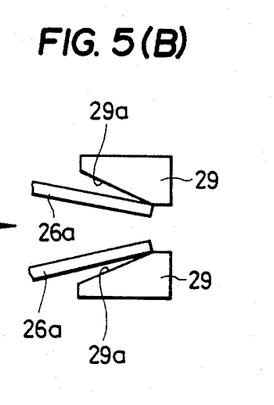

Other means for narrowing the distance between the levers 26a may be used instead of providing the tapered portion of the levers 26a. Namely, also by so forming the protuberances 29 to have tapered portions 29a which are narrowed as approaching the front end of the cross arm 20 as shown in FIGS. 5(a) and 5(b), the same effect can be obtained.

Further, a protuberance integrally formed on the pushbutton 27 for engagement with the plate spring 26 may be used as being a means for fixing the pushbutton 27 and the plate spring 26, instead of the fixture pin 28 which is formed in a separate body. Additionally, the position for fixing the pushbutton 27 and the plate spring 26 may be selected appropriately.

As being a means for pivotally mounting the setting plate 21 on the cross arm 20, the drum portion 25 formed at a lower portion of the setting plate 21 may be downward elongated so as to be inserted in a large shaft bore formed in the cross arm 20, instead of fixing a support shaft on one of the cross arm 20 and the setting plate 21 and forming a shaft bore in the other.

The urging protuberance 22 and the drum portion 25 of the setting plate 21 may be formed separately from the setting plate 21 so as to be secured later or may be formed in one body with the setting plate 21 by a die casting method, etc.

As described in the above, since the cross arm mechanism according to the present invention is so arranged that the plate spring moves on the cross arm together with the pushbutton, and the plate spring is opened at the tip thereof to tighten the setting plate from the front end of the cross arm, it never generates a force to undesirably pull the setting plate toward the front end of the cross arm, thereby eliminating a fault that the memory slide is undesirably pulled in and shifted by the setting plate. Therefore, in the cross arm mechanism according to the present invention, positional deviation of the memory slide never occurs upon lock of the setting plate, so that undesirable movement of the core slide and the core to be moved together with the memory slide can be prevented, thereby ensuring precise preset of a given frequency to a given pushbutton.

Further, since the pushbutton and the plate spring are moved simultaneously, the pushbutton of a plastic resin and the plate spring do not slide with respect to each other. Therefore, wear and deformation of the pushbutton can be avoided. Also, since it is not necessary to mount a slide plate for tightening the plate spring on the pushbutton, the number of parts of the cross arm mechanism can be reduced, leading to realization of reduction in size and thickness of the cross arm mechanism.

FIGS. 6 to 9 show an embodiment corresponding to the second construction according to the present invention. This embodiment mainly includes a pushbutton outer case 71 which is molded with a plastic resin and a U-shaped metallic plate 72 to be contained in the pushbutton outer case 71.

The pushbutton outer case 71 is formed with a slight slit 73 in which a cross arm 1, a plate spring 5 and a metallic plate 72 are inserted. In the upper surface of the slight slit 73 is formed a recess 74 in which stoppers are engaged. That is, the recess 74 is so formed to receive stoppers 75 which project on the upper surface of the metallic plate 72. A pair of right and left tightening protuberances 76 for tightening the plate spring 5 are formed on the lower surface of the metallic plate 72 and at both sides of a cut-in also formed in the metallic plate 72. On the lower surface of the metallic plate 72 is further formed a support axis 77 extending in the opposite direction to the stoppers 75. These protuberances 76 and axis 77 to be provided on the metallic plate 72 may be formed by raising parts of the metallic plate 72 by a press working method. However, this embodiment uses separate pins fixed to the metallic plate by caulking.

Figure 8A:
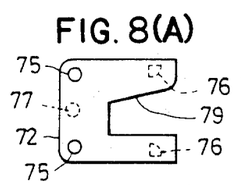
FIG. 8(a) is a plan view of the metallic plate in the embodiment of FIG. 6(a)
Figure 8B:
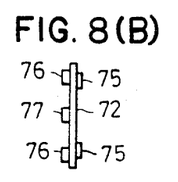
FIG. 8(b) is a front view of the metallic plate.
Figure 8C:
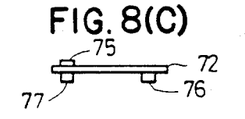
FIG. 8(c) is a side view of the metallic plate.
Figure 9A:
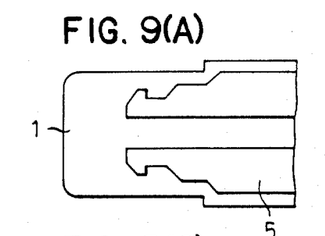
FIG. 9(a) is a plan view of the cross arm and the spring plate in the embodiment of FIG. 6(a)
Figure 9B:
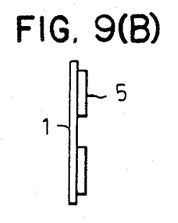
FIG. 9(b) is a front view of the cross arm and the plate spring.
Figure 9C:
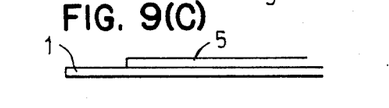
FIG. 9(c) is a side view of the same.

Further, in this embodiment, the projection 78 of the kick arm K is not tapered as shown in FIG. 8(a), and instead, a tapered portion 79 is provided at the inner edge of the cut-in of the metallic plate 72. The tapered portion 79 urges a corner 78a of the rectangular projection of the kick arm K to thereby shift the kick arm K in the longitudinal direction. In this case, the corner 78a of the projection and the tip of the tapered portion 79 of the metallic plate 72 are rounded to ensure smooth contact.

The pushbutton with the construction as described in the above is mounted and assembled on the proximal ends of the cross arm 1 and the plate spring 5 in the following manner.

Figure 6A:
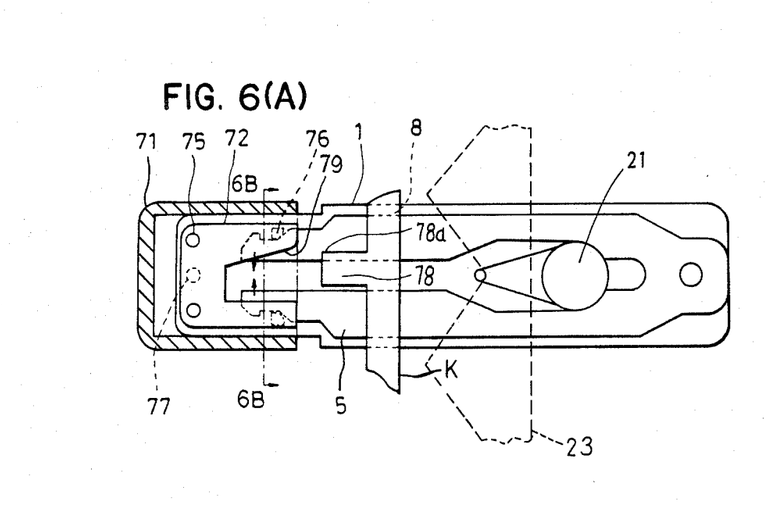
FIG. 6(a) is a plan view of a still further embodiment according to the present invention.
Figure 6B:
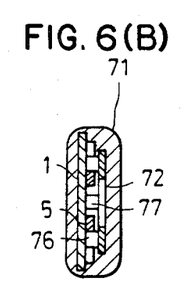
FIG. 6(b) is a sectional view as being sectioned by line 6B—6B in FIG. 6(a)
Figure 6C:
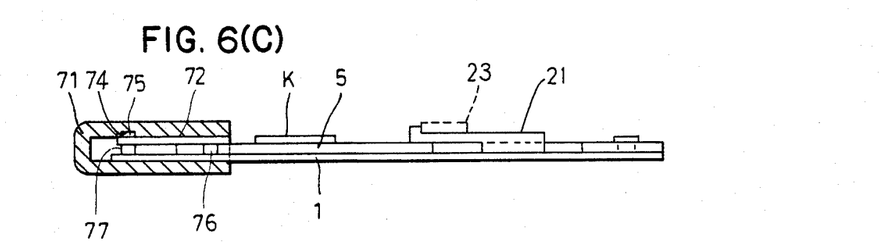
FIG. 6(c) is side view of the embodiment of FIG. 6(a)
Figure 6D:
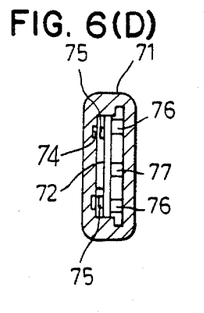
FIG. 6(d) is a back view of the embodiment of FIG. 6(a) as the metallic plate is being inserted.
Figures 7A, 7C:
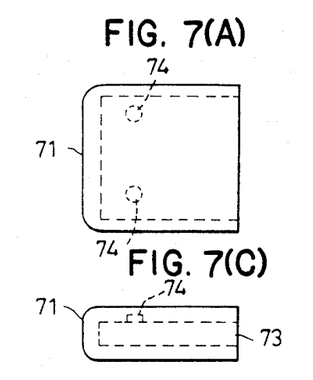
FIG. 7(a) is a plan view of the outer case in the embodiment of FIG. 6(a)
FIG. 7(c) is a side view of the outer case.
Figure 7B:
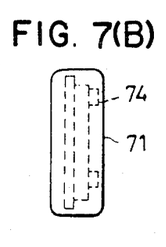
FIG. 7(b) is a front view of the outer case.

The metallic plate 72 is first inserted in the slight slit 73 of the pushbutton outer case 71 so that the stoppers 75 of the metallic plate 72 are engaged in the recess 74 on the upper surface of the slight slit 73 as shown in FIG. 6(c). The cross arm 1 and the plate spring 5 which is fixed on the cross arm 1 are next inserted in the slight slit 73. In this case, arrowhead-shaped portions formed at the right and left proximal ends of the plate spring 5 are inwardly tightened and inserted between the tightening protuberances 76. When the pushbutton is halfway inserted, the tightening protuberances 76 do not urge the plate spring 5 because the plate spring 5 is narrowed at the proximal end thereof, thereby relaxing the fixing force to the setting plate 3. When the pushbutton is fully pushed up to the proximal end of the cross arm, the tightening protuberances 76 press the plate spring 5 from the right and left again, because the proximal end portion of the plate spring 5 is wider. Thereby, the setting plate 3 is fixed unmoved.

Due to insertion of the cross arm 1 and the plate spring 5, the tips of the tightening protuberances 76 and the tip of the support axis 77 abut the surface of the cross arm 1. Therefore, the metallic plate 72 is urged against the upper surface of the slight slit 73 and is prevented from going out of the slight slit 73. Further, the metallic plate 72 is never downward inclined in the slight slit 73, due to existence of the support axis 77 formed on the lower surface of the metallic plate 72, thereby preventing that the stoppers 75 come out of the recess 74.

Next, action of the tapered portion 79 of the metallic plate 72 to urge the projection 78 of the kick arm K to let out the clutch upon push of the pushbutton is performed by merely pushing the pushbutton. Due to this, the corner 78a of the rectangular projection 78 of the kick arm K slides along the tapered portion 79 of the metallic plate 72 to thereby shift the kick arm K in the longitudinal direction. This action is smoothly performed owing to the round configurations of the corner 78a of the projection 78 of the kick arm K and the tip of the tapered portion 79 of the metallic plate 72.

In this embodiment the stoppers 75 of the metallic plate 72 are provided at two positions as seen from the Figure. However, only one stopper may be provided in the center, for example. The support axis 77 need not be only one. The tapered portion 79 formed in the cut-in for urging the kick arm is not inevitable. Instead of the tapered portion, a metallic protuberance which has been used in the prior art may be used or no means for urging the kick arm may be used at all. Further, the tightening protuberances need not be formed on the metallic plate, and intead, pinshaped tightening protuberances may be incorporated in the plastic pushbutton by an insert molding method or other methods.

According to the embodiment, even when the pushbutton is pulled out and fully engaged upon changing or determining a given angle of the setting plate, the tightening protuberances which slidably contact with the plate spring scarcely wear out. At the same time, since the metallic tightening protuberances receive the reaction force of the plate spring 5 and no force is applied to the plastic outer case, the reaction force for tightening the plate spring is not weakened even after repeated operations for a long time.

The embodiments of the invention in which an exclusive property or privilege is claimed are defined as follows:

1. Cross arm mechanism in a pushbutton tuner which comprises:
    a setting plate pivotally mounted on a cross arm of said pushbutton tuner;
    a plate spring disposed on said cross arm so as to be able to hold said setting plate from both sides;
    a pushbutton provided at one end of said cross arm and engaged with said plate spring;
    an urging protuberance provided at one end of said setting plate for engagement with a memory slide of said pushbutton tuner;
    said plate spring being opened at one end thereof nearer to the front end of said cross arm and movable simultaneously with said pushbutton along said cross arm in the length direction of said cross arm when said pushbutton is pushed in; and
    tightening protuberances provided at the front end of said cross arm for narrowing the distance between the opened ends of said plate spring upon advancement of said plate spring to thereby tighten and fix said setting plate.

2. Cross arm mechanism as set forth in claim 1 wherein said opened ends of said plate spring, on which said tightening protuberances slide, are provided with tapered portions.

3. Cross arm mechanism as set forth in claim 1 wherein said tightening protuberances, at portions thereof on which said opened ends of said plate spring slide, are provided with tapered portions.

4. Cross arm mechanism in a pushbutton tuner which comprises:
    a setting plate pivotally mounted on a cross arm of said pushbutton tuner;
    a plate spring disposed on said cross arm so as to be able to hold said setting plate from both sides, said plate spring being opened at one end thereof near the rear end of said cross arm;
    a pushbutton provided on one end of said cross arm and engaged with said plate spring; and
    an urging protuberance provided at one end of said setting plate for engagement with a memory slide of said pushbutton tuner;
    said pushbutton including a case made of a plastic resin and metallic tightening protuberances incorporated in said case, said tightening protuberances narrowing the opened portion of said plate spring upon advancement of said pushbutton to thereby tighten and fix said setting plate.

5. Cross arm mechanism as set forth in claim 4 wherein said pushbutton has a metallic plate in said case, said metallic plate is formed at the upper surface thereof with stoppers, said case is formed at the inner surface thereof with a recess to receive said stoppers, and said tightening protuberances are formed on the lower surface of said metallic plate.

6. Cross arm mechanism as set forth in claim 5 wherein said metallic plate is U-shaped and has a cut-in with a tapered portion formed at the inner edge thereof, said tapered portion being arranged to engage and move a kick arm of said pushbutton tuner upon advancement of said pushbutton.

* * * * *